United States Patent
Casey et al.

(10) Patent No.: US 8,330,324 B2
(45) Date of Patent: Dec. 11, 2012

(54) INTEGRATED PWM SLOPE CONTROL DRIVING MECHANISM FOR GRADUALLY DELIVERING ENERGY TO A CAPACITIVE LOAD

(75) Inventors: Gary Casey, Raheen (IE); Eoin Edward English, Pallasgreen (IE); Christian Jimenez, Valencia (ES); Alberto Marinas, El Puig (ES)

(73) Assignee: Analog Devices, Inc., Norwood, MA (US)

( * ) Notice: Subject to any disclaimer, the term of this patent is extended or adjusted under 35 U.S.C. 154(b) by 182 days.

(21) Appl. No.: 12/796,364

(22) Filed: Jun. 8, 2010

(65) Prior Publication Data
US 2010/0309366 A1    Dec. 9, 2010

Related U.S. Application Data

(60) Provisional application No. 61/185,391, filed on Jun. 9, 2009.

(51) Int. Cl.
H01L 41/09    (2006.01)
H02N 2/06    (2006.01)
(52) U.S. Cl. ........................................ 310/317
(58) Field of Classification Search .......... 310/314, 310/317, 328
See application file for complete search history.

(56) References Cited

U.S. PATENT DOCUMENTS

| | | | |
|---|---|---|---|
| 5,668,744 A | 9/1997 | Varadan et al. | |
| 5,917,267 A | 6/1999 | Miyazawa et al. | |
| 6,863,055 B2 | 3/2005 | Rueger | |
| 7,212,358 B2 | 5/2007 | Mattsson et al. | |
| 7,271,522 B2 * | 9/2007 | Yuasa et al. | 310/317 |
| 7,639,232 B2 | 12/2009 | Grant et al. | |
| 2001/0026112 A1 * | 10/2001 | Yoshida et al. | 310/328 |
| 2003/0047395 A1 | 3/2003 | Patton | |
| 2003/0121332 A1 | 7/2003 | Mathew et al. | |
| 2006/0001332 A1 | 1/2006 | Ollila | |
| 2007/0080608 A1 * | 4/2007 | Maruyama et al. | 310/317 |
| 2008/0048523 A1 * | 2/2008 | Ishii et al. | 310/317 |
| 2008/0300055 A1 | 12/2008 | Lutnick et al. | |

OTHER PUBLICATIONS

PCT International Search Report for PCT/US10/037783 mailed on Aug. 10, 2010.

* cited by examiner

*Primary Examiner* — Derek Rosenau
(74) *Attorney, Agent, or Firm* — Kenyon & Kenyon LLP

(57) ABSTRACT

An apparatus, system and method for controlling drive patterns is disclosed. A digital engine for controlling drive patterns may include a profile controller to program characteristics of one or more drive patterns for one or more piezoelectric actuators. The digital engine may further include a register array to store profile information for the one or more drive patterns. Each drive pattern may comprise a plurality of pulses with each pulse having a slope. The digital engine may also include a digital pattern generator to generate the one or more drive patterns based upon the profile information stored in the register array. The digital engine may further include a slope shaping circuit to modify one or more signals based upon an input from the digital pattern generator.

16 Claims, 6 Drawing Sheets

US 8,330,324 B2

INTEGRATED PWM SLOPE CONTROL DRIVING MECHANISM FOR GRADUALLY DELIVERING ENERGY TO A CAPACITIVE LOAD

CROSS-REFERENCE TO RELATED APPLICATIONS

This application claims priority to U.S. Provisional Patent Application No. 61/185,391, filed Jun. 9, 2009, which is herein incorporated by reference in its entirety.

BACKGROUND

Many electronic devices contain electromechanical motors, such as piezoelectric actuators. Piezoelectric actuators are driven using bursts of single-ended or differentially applied voltage pulses. As each pulse is applied to a piezoelectric material contained within the actuator, the piezoelectric material changes shape through contraction or expansion, thus creating motion using the mechanical parts of the system. Piezoelectric actuators are used in many consumer electronic devices such as digital cameras and mobile phones. For example, a piezoelectric actuator may be used to adjust the lens of a camera in operations such as focus or zoom. A piezoelectric actuator may also be used to provide haptic feedback to the touchscreen of an electronic device, such as a mobile phone.

With the evolution of features and functions on mobile handheld devices, consumers are expecting continuous auto-focus and higher video capture rates for high definition video capture. With higher auto-focus frame rates, the camera lens has to move more often than it did in the past, for example, 60 frames per second compared to 15 frames per second or less. When using piezoelectric actuators, there is an increase in the intensity in the audible noise generated as the piezoelectric actuator is required to start and stop more often. This undesirable audible noise may be picked up by the microphone on the mobile handheld device. The audible noise may be reduced using an expensive mechanical design which may negatively impact features of a mobile handheld device, such as the height profile, the location of the microphone and cost of the device. Therefore, a need exists for an electrical drive scheme that will reduce unwanted noise content and will not impact the size or the cost of the mobile handheld device.

As discussed above, a common problem with piezoelectric actuators is that audible noise is produced during starting and stopping of the mechanical movement. Mechanical vibrations may be present during the starting or stopping of a piezoelectric actuator because of a sudden change in acceleration. Due to the mechanical vibrations produced during starting and stopping operations of the mechanical movement, the mechanical parts may produce audible noise that is generally undesirable. Previous solutions have developed ways of gradually starting and stopping an electromechanical actuator. Among these is the amplitude modulation of pulse width modulated (PWM) pulses driven to the actuator and a PWM controlled constant current source. However, a PWM controlled constant current source does not allow the generation of some signal patterns, such as a square signal patterns. Square signal patterns are required to drive friction driven actuators in order to take advantage of mechanical resonance.

Further, amplitude modulation solutions limit the programmability and control over the amplitude, which is undesirable in situations that require constant amplitude or that require the programmability of the amplitude to control audible noise. Further, using amplitude modulation to control start and stop operations of a mechanical movement generally requires complex circuitry used to generate a variable amplitude from a supply voltage of a device. The use of additional complex circuitry increases the design time, cost and efficiency of such a system. Therefore, a need exists for an improved solution to reduce or control audible noise during start and stop operations while providing programmability and control over the amplitude, reducing displacement and using a reduced silicon area.

DETAILED DESCRIPTION

One or more embodiments relate to PWM electrically-driven electromechanical systems where the mechanical system can be expected to exhibit audible noise in response to electrical driving signals of certain profiles. In particular, audible noise may be produced during the starting and stopping operations for the mechanical movement. To reduce the generation of audible noise, embodiments of the present invention may deliver energy gradually to an electromechanical actuator using modulated slopes and a constant amplitude. Embodiments of the present invention may provide several advantages and system level flexibility not found in previous solutions.

In an embodiment including a friction driven electromechanical actuator, such as one used for a camera lens, the current solution may increase and decrease the speed during stop and start operations for the mechanical movement with multiple pulses using modulated slopes. In this manner, during a start operation, speed may be gradually built up from an inefficient mode to an efficient mode, or in other words, gradually reaching a maximum displacement per stroke. The opposite may occur during a stop operation. Embodiments described herein may allow the actuator to change from inefficient movement to maximum efficiency during start operations of the electromechanical actuator and thus gradually increase the speed by controlling the edge rate of both rising and falling edges with a fixed voltage supply. The current solution may also be utilized during stop operations. This control may be beneficial in haptic applications where the amplitude of the audible noise is desirable to coincide with confirmation of touch generated by the movement of the electromechanical actuator, thus enhancing the user experience. In such an embodiment, only a single pulse or small number of pulses may be necessary to produce the maximum displacement per stroke. The amplitude of the audible noise may need to be controlled and programmed by the user. The current solutions allows for control of the amplitude of the noise without reducing displacement. In this manner, the current solution may offer a large degree of programmability and control over the amplitude of the audible noise produced during start and stop operations.

Figure 1:
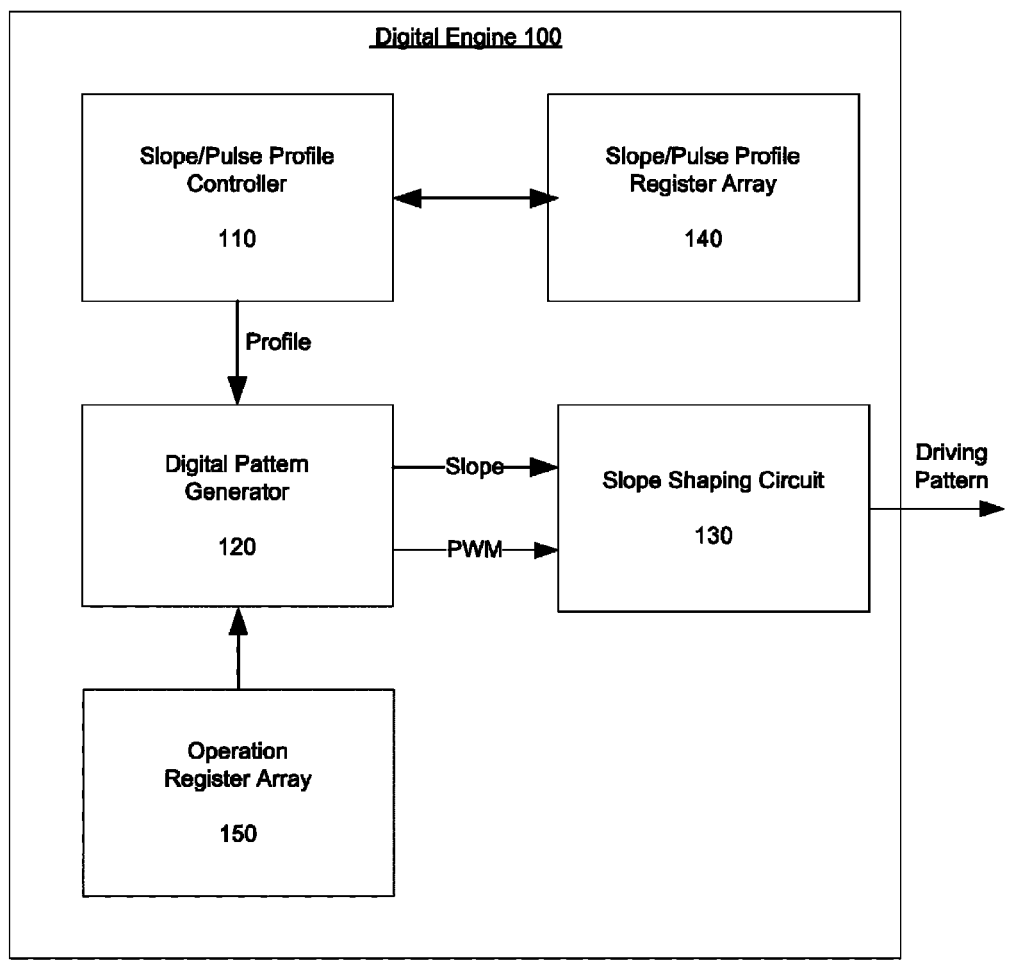
FIG. 1 illustrates an embodiment of a driving system.

FIG. 1 illustrates one embodiment of a driving system. As shown, a driving system may include a digital engine 100. The digital engine 100 may provide programmability for characteristics of one or more drive patterns for a electromechanical actuator. Characteristics for the one or more drive patterns may include the number of pulses and corresponding slopes used to drive the electromechanical actuator. During operation, a plurality of pulses within a drive signal may be used to control a piezoelectric actuator. The pulses may be controlled such that a constant amplitude is maintained for each pulse, but the slope of the pulses increases or decreases based upon a desired operation. The digital engine 100 may include a slope/pulse profile controller 110. The slope/pulse profile controller 110 may be a processor within digital engine 100. The slope/pulse profile controller 110 may provide profile information based upon the desired state of the electromechanical actuator. For example, the profile controller 110 may provide profiles for pulse and slope information in various situations, such as start and stop operations for the mechanical movement. In addition, the profile controller 110 may provide a profile for steady slope and pulse operation. Profile information may be sent to the profile controller 110 by a processor based upon system commands or user input.

In an embodiment of the present invention, slope information may include a plurality of decreasing slopes for a plurality of pulses within the one or more drive patterns corresponding to a stop operation. The plurality of decreasing slopes may reduce audible noise during the stop operation while maintaining a constant amplitude for each of the plurality of pulses. Further, slope information may include a plurality of increasing slopes for a plurality of pulses within the one or more drive patterns corresponding to a start operation. The plurality of increasing slopes may reduce audible noise during the start operation while maintaining a constant amplitude for each of the plurality of pulses.

In an embodiment, the digital engine 100 may include a slope/pulse profile register array 140. The slope/pulse profile register array 140 may store profile information for one or more profiles. The slope/pulse profile register array 140 may comprise a memory module capable of storing one or more profiles. Profile information may include, but is not limited to, slope information, number of pulses during an operation, number of slope changes for an operation, number of pulses during an operation and slope change information. For example, profile information may correspond to one or more drive patterns with each drive pattern comprising a plurality of pulses, each pulse having a slope. The slope/pulse profile register array 140 may be programmable with profile information. In addition, the slope/pulse profile register array 140 may be pre-programmed with profile information during the manufacturing process. The profile information stored within the slope/pulse profile register array 140 may be accessible by the profile controller 110, thus allowing the profile controller 110 to retrieve the desired profile information.

In an embodiment, the profile controller 110 may send profile information to a digital pattern generator 120, which may be software or instructions stored within a memory such as operation register array 150. Operation register array 150 may comprise a memory module capable of storing software or instructions. The pattern generator 120 may use the profile information to generate a desired digital drive pattern. In this manner, the slope and the number of pulses/time at which the slope is applied may be programmable. The pattern generator 120 may send slope and signal information to the slope shaping circuit 130. The slope shaping circuit 130 may be any digital signal processing circuit known in the art that may be used to modify the slope of a signal, such as a PWM signal. The slope shaping circuit 130 may send the complete driving pattern to a electromechanical actuator.

Figure 2:
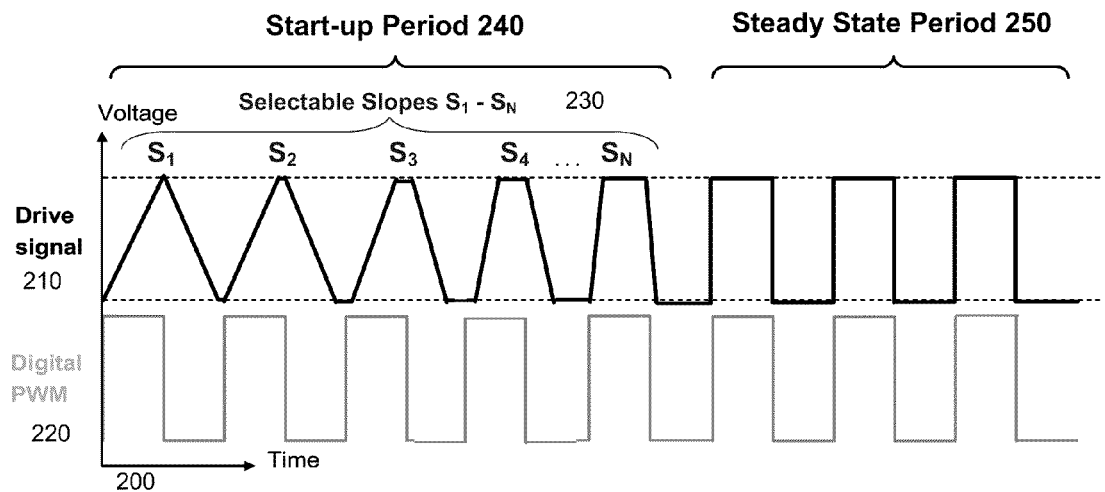
FIG. 2 illustrates the drive signals generated by an embodiment of an integrated driving system.

FIG. 2 illustrates a graph 200 including the drive signals 210 and digital PWM 220 generated by an embodiment of an integrated driving system. The current solution may modulate the slopes of signals, such as PWM signals, to gradually apply energy to a electromechanical actuator, such as a piezoelectric actuator. As illustrated, FIG. 2 may include selectable slopes $S_1$-$S_N$ 230 used during start-up period 240. As shown, the slopes 230 may gradually increase over time from slope $S_1$ until slope $S_N$. The gradual increase in slope may translate into a controlled slow increase in energy delivered to the electromechanical actuator. In this manner, the moving parts within the motor may gradually begin to move, resulting in decreased audible noise.

In an embodiment, slopes $S_1$-$S_N$ 230 are selectable and may be programmable based upon the particular electromechanical actuator being used. Further, slopes $S_1$-$S_N$ 230 may be selected and may be programmed based on the desired audible noise reduction. Slopes $S_1$-$S_N$ 230 may represent each pulse required during the period of time for a start operation. The number of pulses in a given period of time and the slope of each pulse may be programmable and stored in a profile. For example, a start operation for a particular electromechanical actuator may include customized information to optimize a reduction in audible noise. During the start operation, audible noise conventionally caused by sudden acceleration may be dramatically reduced using the customized pulse and slope information. After the start operation as been completed, the system may drive the actuator using traditional square wave patterns, such as illustrated by steady state period 250, until a stop operation is needed.

Figure 3:
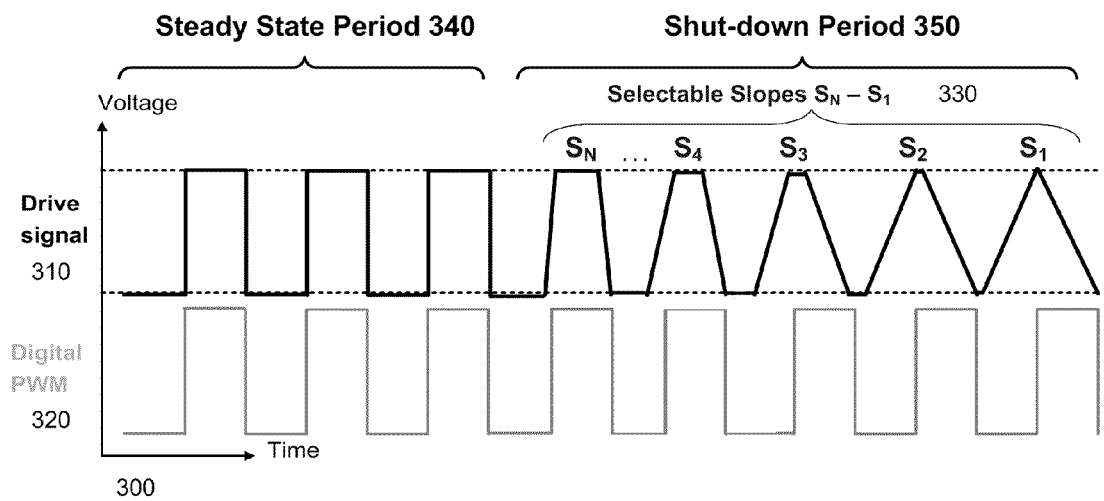
FIG. 3 illustrates the drive signals generated by an embodiment of an integrated driving system.

FIG. 3 illustrates a graph 300 including the drive signals 310 and the digital PWM 320 generated by an embodiment of an integrated driving system. The current solution may modulate the slopes of PWM signals to gradually decrease energy applied to a electromechanical actuator, such as a piezoelectric actuator, during a stop operation. A stop operation may be used to transition from a steady state period 340 to a shut-down period 350. As illustrated, FIG. 3 includes selectable slopes $S_N$-$S_1$ 330 used during shut-down period 350. As shown, the slopes 330 gradually decrease over time from slope $S_N$ until slope $S_1$. The gradual decrease in slope translates into a controlled slow decrease in energy delivered to the electromechanical actuator. Slopes $S_N$-$S_1$ 330 are selectable and may be programmable based upon the particular electromechanical actuator being used or desired audible noise reduction. Slopes $S_N$-$S_1$ 330 represent each pulse required during the period of time for a stop operation. During the stop operation, audible noise conventionally caused by sudden deceleration may be dramatically reduced. Although the start and stop profiles illustrated in FIG. 2 and FIG. 3 may be similar, different profiles may be used for start and stop operations.

Figure 4:
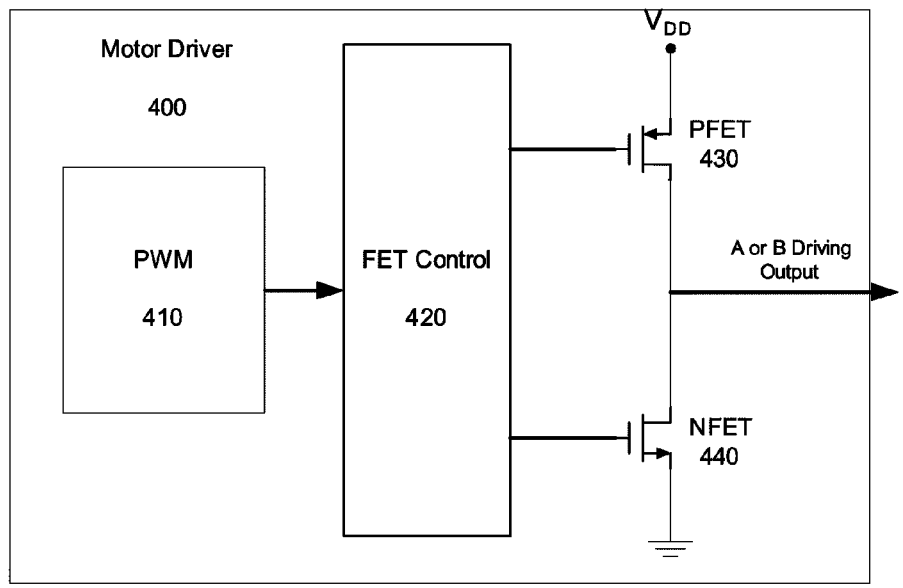
FIG. 4 illustrates an embodiment of the present invention.

FIG. 4 illustrates an embodiment of the present invention. The embodiment illustrated within FIG. 4 may also reduce electro-magnetic interference (EMI). Motor driver 400 may be used to drive an electromechanical motor, such as a piezoelectric actuator. Motor driver 400 may include PWM 410, which may be a digital PWM pattern generator. PWM 410 may control the gate voltage of PFET 430 and NFET 440 via a FET control block 420 such that PFET 430 and NFET 440 are turned on and off in a smooth or gradual manner. PFET 430 and NFET 440 may be turned on or off in a gradual manner by applying various slopes to PFET 430 and NFET 440 instead of a pure digital input signal by the FET control block 420. In this manner, each of PFET 430 and NFET 440 are not turned on or off instantaneously, but instead are gradually turned on or off allowing for the edge shaping illustrated within FIG. 5.

Figure 5:
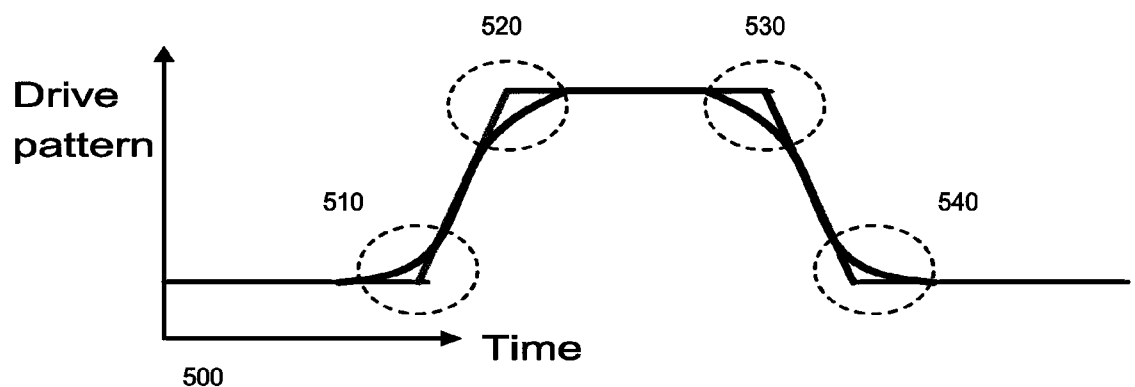
FIG. 5 illustrates the slope modulation generated by an embodiment of the present invention.

FIG. 5 illustrates edge shaping produced by an embodiment of the present invention. As illustrated by graph 500, the control of pulse slope, as previously described with respect to FIG. 4, allows the system to filter high frequency components of the driving voltage or currents leading to a reduced EMI. The system may contain profiles used during steady state that control the reduction of EMI. In this manner, the driving mechanism may be used to control the slope during steady state by using a selected slope that reduces EMI and is sufficient to maintain the desired speed or movement of the electromechanical actuator. As illustrated within chart 500, the drive pattern at points 510, 520, 530 and 540 is smooth and gradual.

Figure 6:
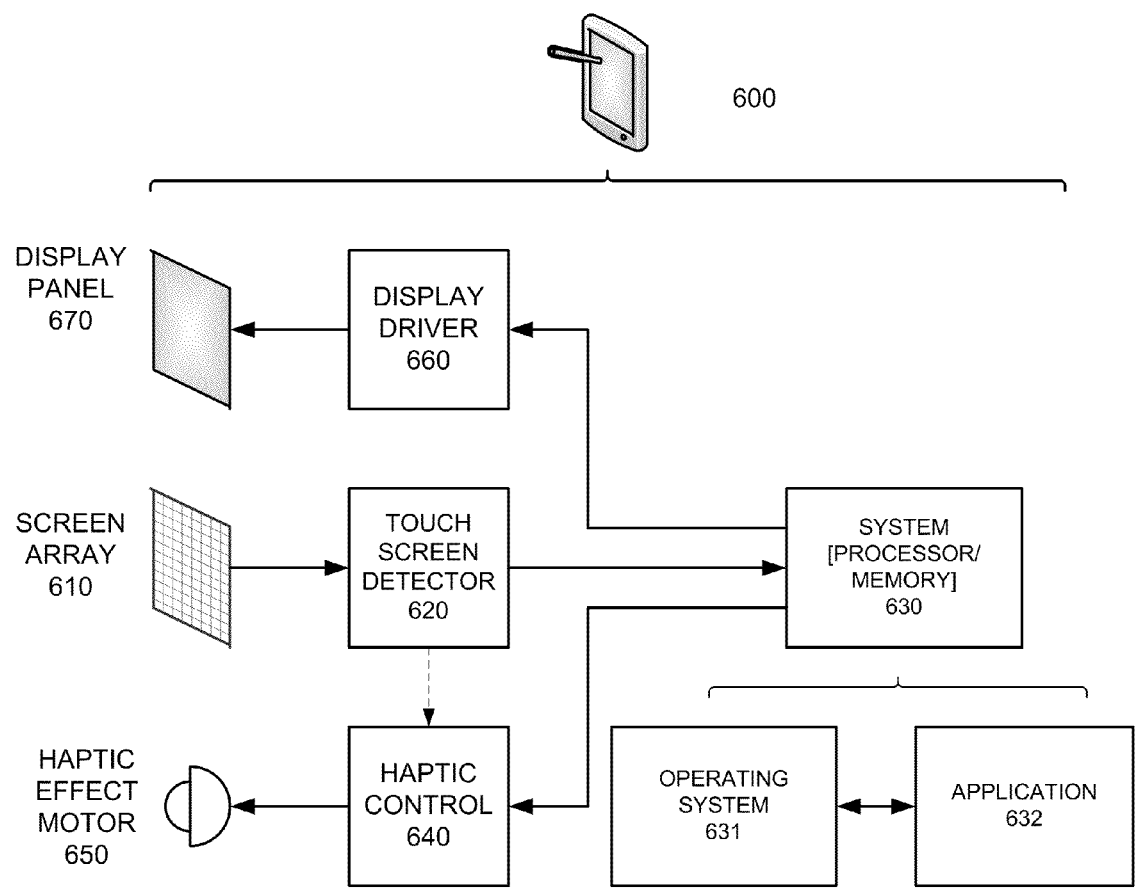
FIG. 6 illustrates an embodiment for controlling haptics of a touch screen device using a haptic system level solution.

FIG. 6 illustrates an embodiment of a touch screen device 600 using a haptic system. The touch screen device 600 may include a screen array 610 that may be coupled to a touch screen detector 620. The screen array 610 may be capable of responding to human touch or a pointing device, such as a stylus. Such screen arrays may be capacitive or resistive touch screens. As a force or capacitive input is applied to the screen array 610, an input signal corresponding to the force or capacitive input may be sent to the touch screen detector 620. Touch screen input may include a single input or multiple simultaneous inputs. Further, the touch screen input may include gestures such as swiping the touch screen with one or more fingers. Still further, the touch screen input may include the amount of force or speed of input applied to the touch screen. The touch screen detector 620 may convert the input signal into data and send the data to a system processor 630. The touch screen detector 620 may also send the data directly to a haptic control 640. The system processor 630 may include a processor and a memory. The memory may be used to store a database or set of profiles for actions that correspond to touch screen input. For example, a particular type of input to the touch screen module may correspond to an associated haptic feedback. The system processor 630 may send a command or code signal to the haptic control 640 that corresponds to the received touch screen input. Alternatively, the haptic control 640 may include a processor and a memory where the memory is used to store a database or set of profiles for actions that correspond to touch screen input.

The haptic control 640 may generate a drive signal and send the drive signal to a haptic effect motor 650, which may include a strip or disk type piezoelectrical actuator. In an exemplary embodiment, haptic control 640 may include a digital engine, such as digital engine 100. Haptic control 640 may control the amplitude of an audio tone or haptic feedback by modulating the edge rate of the drive signal applied to an electromechanical actuator, such as a piezoelectric driven actuator. Control of this drive signal may allow the user of the touch screen input device to select the loudness or quietness of the tactile feedback by controlling the acceleration, deceleration or force of the touch screen input.

Further, the system processor 630 may include an operating system 631 and an application 632. The application 632 may be a program that may control the operations of the device 600 when executed on the operating system 631.

The system processor 630 may also be coupled to a display driver 660. The system processor 630 may send display instruction signals to the display driver 660 in response to the data signals received from the touch screen controller 620. In response to the display instruction signals, the display driver 660 may control the operations of the display panel 670. For example, when a user selects an option using the screen array 610, the display panel 670 may change according to the user selected option.

Figure 7:
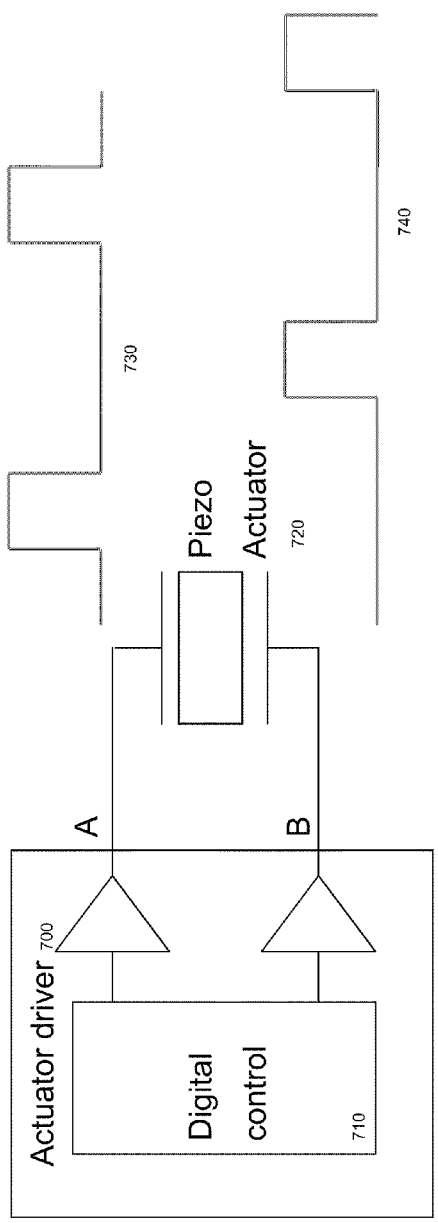
FIG. 7 illustrates an embodiment of a driving system.

FIG. 7 illustrates an embodiment of a driving system. Actuator driver 700 is used to generate drive signals A and B. Drive signals A and B may be controlled by digital control 710. As illustrated, signals A and B generate alternating drive patterns 730 and 740 that may be used to drive a piezoelectric actuator 720. In this embodiment, piezoelectric actuator 720 is driven using two alternating patterns 730 and 740, which may be desirable for particular electromechanical motors. In an exemplary embodiment, a first drive pattern and a second drive pattern may be used. Slopes for pulses within the first drive pattern may be proportional to widths of the pulses within the second drive pattern. It can be appreciated that one or more embodiments may use three or more drive signals. For example, three drive signals may be used in an embodiment that includes a three terminal electromechanical motor.

Figure 8:
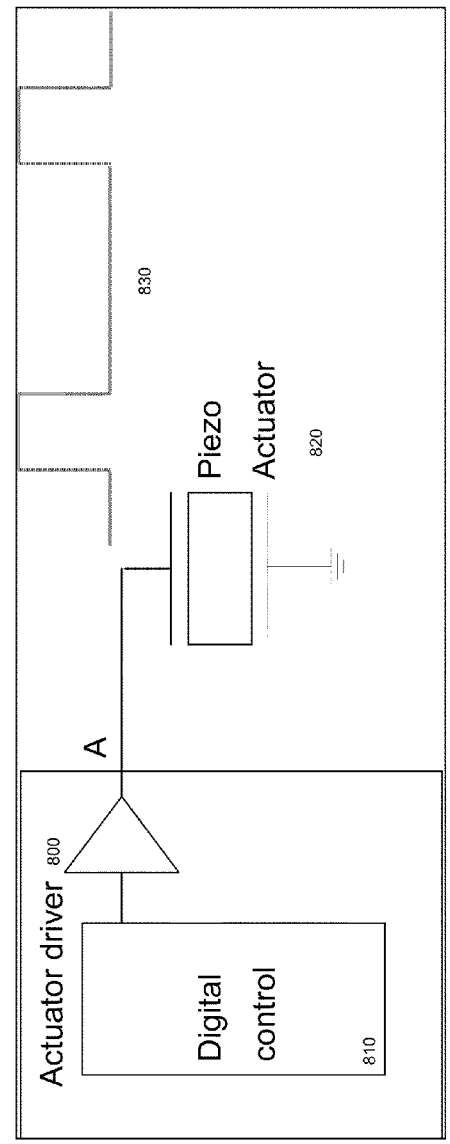
FIG. 8 illustrates an embodiment of a driving system.

FIG. 8 illustrates an embodiment of a driving system. Actuator driver 800 is used to generate drive signal A. Drive signal A may be controlled by digital control 810. Drive signal A generates a single drive pattern 830. As illustrated, only a single drive signal A is used to drive piezoelectric actuator 820, which may be desirable for particular electromechanical motors.

Figure 9:
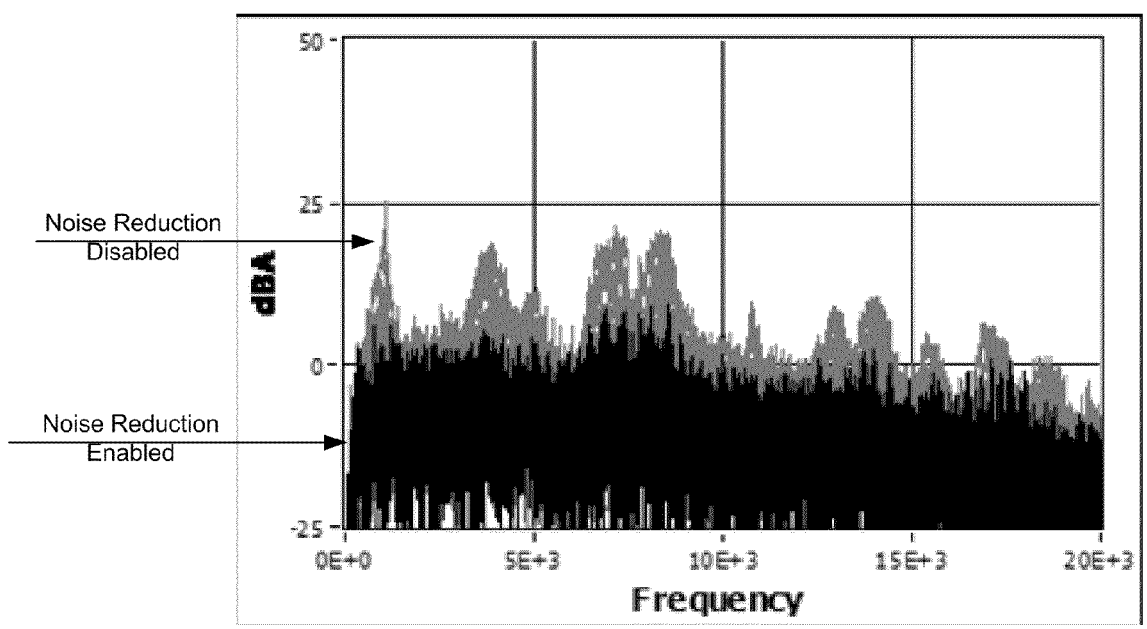
FIG. 9 illustrates the possible reduction in audible noise using an embodiment of the present invention.

FIG. 9 illustrates the possible reduction in audible noise using an embodiment of the present invention. The chart represents the measured noise reduction using a driving system according to an embodiment of the present invention used in conjunction with a camera lens. As illustrated, the top line represents the audible noise produced by the camera lens without a noise reduction driving system enabled. The bottom line represents the audible noise produced by the camera lens using a driving system according to an embodiment of the present invention has been enabled. As shown, the audible noise may be greatly reduced using an embodiment of the present invention.

Numerous specific details have been set forth herein to provide a thorough understanding of the embodiments. It will be understood by those skilled in the art, however, that the embodiments may be practiced without these specific details. In other instances, well-known operations, components and circuits have not been described in detail so as not to obscure the embodiments. It can be appreciated that the specific structural and functional details disclosed herein may be representative and do not necessarily limit the scope of the embodiments.

Various embodiments may be implemented using hardware elements, software elements, or a combination of both. Examples of hardware elements may include processors, microprocessors, circuits, circuit elements (e.g., transistors, resistors, capacitors, inductors, and so forth), integrated circuits, application specific integrated circuits (ASIC), programmable logic devices (PLD), digital signal processors (DSP), field programmable gate array (FPGA), logic gates, registers, semiconductor device, chips, microchips, chip sets, and so forth. Examples of software may include software components, programs, applications, computer programs, application programs, system programs, machine programs, operating system software, middleware, firmware, software modules, routines, subroutines, functions, methods, procedures, software interfaces, application program interfaces (API), instruction sets, computing code, computer code, code segments, computer code segments, words, values, symbols, or any combination thereof. Determining whether an embodiment is implemented using hardware elements and/or software elements may vary in accordance with any number of factors, such as desired computational rate, power levels, heat tolerances, processing cycle budget, input data rates, output data rates, memory resources, data bus speeds and other design or performance constraints.

Some embodiments may be implemented, for example, using a computer-readable medium or article which may store an instruction or a set of instructions that, if executed by a computer, may cause the computer to perform a method and/or operations in accordance with the embodiments. Such a computer may include, for example, any suitable processing platform, computing platform, computing device, processing device, computing system, processing system, computer, processor, or the like, and may be implemented using any suitable combination of hardware and/or software. The computer-readable medium or article may include, for example, any suitable type of memory unit, memory device, memory article, memory medium, storage device, storage article, storage medium and/or storage unit, for example, memory, removable or non-removable media, erasable or non-erasable media, writeable or re-writeable media, digital or analog media, hard disk, floppy disk, Compact Disk Read Only Memory (CD-ROM), Compact Disk Recordable (CD-R), Compact Disk Rewriteable (CD-RW), optical disk, magnetic media, magneto-optical media, removable memory cards or disks, various types of Digital Versatile Disk (DVD), a tape, a cassette, or the like. The instructions may include any suitable type of code, such as source code, compiled code, interpreted code, executable code, static code, dynamic code, encrypted code, and the like, implemented using any suitable high-level, low-level, object-oriented, visual, compiled and/or interpreted programming language.

We claim:

1. An apparatus for controlling drive patterns, the apparatus comprising:
    a profile controller to program characteristics of one or more drive patterns for a piezoelectric actuator;
    a register array to store profile information for the one or more drive patterns, each drive pattern comprising a plurality of pulses, wherein a portion of each drive pattern has pulses of mutually different slopes;
    a digital pattern generator to generate the one or more drive patterns based upon the profile information stored in the register array; and
    a slope shaping circuit to modify one or more signals based upon an input from the digital pattern generator.

2. The apparatus of claim 1, wherein the programmed characteristics of the one or more drive patterns include slope information for the one or more drive patterns.

3. The apparatus of claim 2, wherein the slope information includes a plurality of decreasing slopes for a plurality of pulses within the one or more drive patterns for a stop operation, the plurality of decreasing slopes reducing audible noise during the stop operation while maintaining a constant amplitude for each of the plurality of pulses.

4. The apparatus of claim 2, wherein the slope information includes a plurality of increasing slopes for a plurality of pulses within the one or more drive patterns for a start operation, the plurality of increasing slopes reducing audible noise during the start operation while maintaining a constant amplitude for each of the plurality of pulses.

5. The apparatus of claim 1, wherein the characteristic information includes a number of pulses for the one or more drive patterns and a number of slope changes for the one or more drive patterns.

6. The apparatus of claim 1, wherein the register array stores profile information for a first drive pattern and a second drive pattern, wherein slopes for pulses within the first pattern are proportional to widths of the pulses within the second drive pattern.

7. The apparatus of claim 1, wherein the apparatus is located within a motor driver of a touch-screen portable electronic device, the motor driver controlling a haptic effect motor for producing haptic feedback.

8. The apparatus of claim 1, wherein the apparatus is located within a motor driver of a portable electronic device, the motor driver controlling a camera lens within the portable electronic device.

9. An apparatus for controlling drive patterns, the apparatus comprising:
    a profile controller to program characteristics of a drive pattern for one or more piezoelectric actuators;
    a register array to store profile information for the drive pattern, the drive pattern comprising a plurality of pulses having mutually different slopes;
    a digital pattern generator to generate the drive pattern based upon the profile information stored in the register array; and
    a slope shaping circuit to modify one or more signals based upon an input from the digital pattern generator.

10. The apparatus of claim 9, wherein the programmed characteristics of the drive pattern includes slope information for the drive pattern.

11. The apparatus of claim 10, wherein the slope information includes a plurality of decreasing slopes for a plurality of pulses within the drive pattern for a stop operation, the plurality of decreasing slopes reducing audible noise during the stop operation while maintaining a constant amplitude for each of the plurality of pulses.

12. The apparatus of claim 10, wherein the slope information includes a plurality of increasing slopes for a plurality of pulses within the drive pattern for a start operation, the plurality of increasing slopes reducing audible noise during the start operation while maintaining a constant amplitude for each of the plurality of pulses.

13. The apparatus of claim 9, wherein the characteristic information includes a number of pulses for the drive pattern and a number of slope changes for the drive pattern.

14. The apparatus of claim 9, wherein the register array stores profile information for a first drive pattern and a second drive pattern, wherein slopes for pulses within the first pattern are proportional to widths of the pulses within the second drive pattern.

15. The apparatus of claim 9, wherein the apparatus is located within a motor driver of a touch-screen portable electronic device, the motor driver controlling a haptic effect motor for producing haptic feedback.

16. The apparatus of claim 9, wherein the apparatus is located within a motor driver of a portable electronic device, the motor driver controlling a camera lens within the portable electronic device.

* * * * *